(12) United States Patent
Suzuki et al.

(10) Patent No.: US 10,176,994 B2
(45) Date of Patent: Jan. 8, 2019

(54) SEMICONDUCTOR DEVICE AND METHOD OF MANUFACTURING THE SAME

(71) Applicant: Mitsubishi Electric Corporation, Tokyo (JP)

(72) Inventors: Kenji Suzuki, Tokyo (JP); Atsushi Narazaki, Tokyo (JP); Ryu Kamibaba, Tokyo (JP); Yusuke Fukada, Tokyo (JP); Katsumi Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/545,732

(22) PCT Filed: Mar. 13, 2015

(86) PCT No.: PCT/JP2015/057539
§ 371 (c)(1),
(2) Date: Jul. 24, 2017

(87) PCT Pub. No.: WO2016/147264
PCT Pub. Date: Sep. 22, 2016

(65) Prior Publication Data
US 2018/0019131 A1     Jan. 18, 2018

(51) Int. Cl.
*H01L 29/74*     (2006.01)
*H01L 31/111*     (2006.01)
(Continued)

(52) U.S. Cl.
CPC ...... *H01L 21/26513* (2013.01); *H01L 21/268* (2013.01); *H01L 21/283* (2013.01);
(Continued)

(58) Field of Classification Search
CPC ............. H01L 21/26513; H01L 21/268; H01L 21/283
(Continued)

(56) References Cited

U.S. PATENT DOCUMENTS

2012/0267681 A1    10/2012   Nemoto et al.
2014/0217407 A1    8/2014   Mizushima et al.
(Continued)

FOREIGN PATENT DOCUMENTS

JP     2002-507058 A     3/2002
JP     2002507058 A *    3/2002   ............. H01L 21/04
(Continued)

OTHER PUBLICATIONS

International Search Report issued in PCT/JP2015/057539; dated May 12, 2015.
(Continued)

*Primary Examiner* — David S Blum
(74) *Attorney, Agent, or Firm* — Studebaker & Brackett PC

(57) ABSTRACT

A p-type base layer (2) is formed on a surface of an n-type silicon substrate (1). First and second $n^+$-type buffer layers (8,9) 9 are formed on a back surface of the n-type silicon substrate (1). The first $n^+$-type buffer layer (8) is formed by a plurality of implantations of protons at different accelerating voltages and has a plurality of peak concentrations with different depths from the back surface of the n-type silicon substrate (1). The second $n^+$-type buffer layer (9) is formed by an implantation of a phosphorus. A position of a peak concentration of the phosphorus is shallower from the back surface of the n-type silicon substrate (1) than positions of peak concentrations of the protons. The peak concentration of the phosphorus is higher than the peak concentrations of the protons. A concentration of the protons is higher than a concentration of the phosphorus at the positions of the peak concentrations of the protons.

11 Claims, 8 Drawing Sheets

(51) Int. Cl.
- *H01L 21/265* (2006.01)
- *H01L 29/739* (2006.01)
- *H01L 29/78* (2006.01)
- *H01L 29/861* (2006.01)
- *H01L 21/268* (2006.01)
- *H01L 21/283* (2006.01)
- *H01L 21/324* (2006.01)
- *H01L 29/08* (2006.01)
- *H01L 29/10* (2006.01)
- *H01L 29/167* (2006.01)
- *H01L 29/36* (2006.01)
- *H01L 29/417* (2006.01)
- *H01L 29/66* (2006.01)
- *H01L 29/06* (2006.01)
- *H01L 29/45* (2006.01)
- *H01L 29/16* (2006.01)
- *H01L 29/20* (2006.01)

(52) U.S. Cl.
CPC ........ *H01L 21/324* (2013.01); *H01L 29/0804* (2013.01); *H01L 29/0821* (2013.01); *H01L 29/1004* (2013.01); *H01L 29/167* (2013.01); *H01L 29/36* (2013.01); *H01L 29/41708* (2013.01); *H01L 29/66136* (2013.01); *H01L 29/66348* (2013.01); *H01L 29/739* (2013.01); *H01L 29/7397* (2013.01); *H01L 29/78* (2013.01); *H01L 29/861* (2013.01); *H01L 29/0696* (2013.01); *H01L 29/1602* (2013.01); *H01L 29/2003* (2013.01); *H01L 29/456* (2013.01)

(58) Field of Classification Search
USPC .......................................... 257/139; 438/530
See application file for complete search history.

(56) References Cited

U.S. PATENT DOCUMENTS

| 2014/0299915 A1 | 10/2014 | Kouno et al. |
| 2014/0374793 A1 | 12/2014 | Miyazaki et al. |
| 2015/0179441 A1 | 6/2015 | Onozawa |

FOREIGN PATENT DOCUMENTS

| JP | 2002-532886 A | 10/2002 | |
| JP | 4128777 B2 * | 7/2008 | ....... H01L 21/26506 |
| JP | 2013-138172 A | 7/2013 | |
| JP | 2013138172 A * | 7/2013 | ........... H01L 21/263 |
| JP | WO 2013147274 A1 * | 10/2013 | ........... H01L 21/265 |
| WO | 99/046809 A1 | 9/1999 | |
| WO | 00/35022 A1 | 6/2000 | |
| WO | 01/086712 A1 | 11/2001 | |
| WO | 2011052787 A1 | 5/2011 | |
| WO | 2013/073623 A1 | 5/2013 | |
| WO | 2013/147274 A1 | 10/2013 | |
| WO | 2014/065080 A1 | 5/2014 | |

OTHER PUBLICATIONS

An Office Action issued by the Japanese Patent Office dated Jan. 9, 2018, which corresponds to Japanese Patent Application No. 2017-505779 and is related to U.S. Appl. No. 15/545,732; with English translation.

An Office Action; "Notification of Reasons for Refusal," mailed by the Japanese Patent Office dated Mar. 13, 2018, which corresponds to Japanese Patent Application No. 2017-505779 and is related to U.S. Appl. No. 15/545,732; with English translation.

Notification of Transmittal of Translation of the International Preliminary Report on Patentability (Chapter I) and Translation of Written Opinion of the International Searching Authority; PCT/JP2015/057539; dated Sep. 28, 2017.

An Office Action mailed by the Japanese Patent Office dated Aug. 14, 2018, which corresponds to Japanese Patent Application No. 2017-505779 and is related to U.S. Appl. No. 15/545,732.

An Office Action mailed by the Japanese Patent Office dated Dec. 4, 2018, which corresponds to Japanese Patent Application No. 2017-505779 and is related to U.S. Appl. No. 15/545,732; with English translation.

* cited by examiner

[FIG. 1]
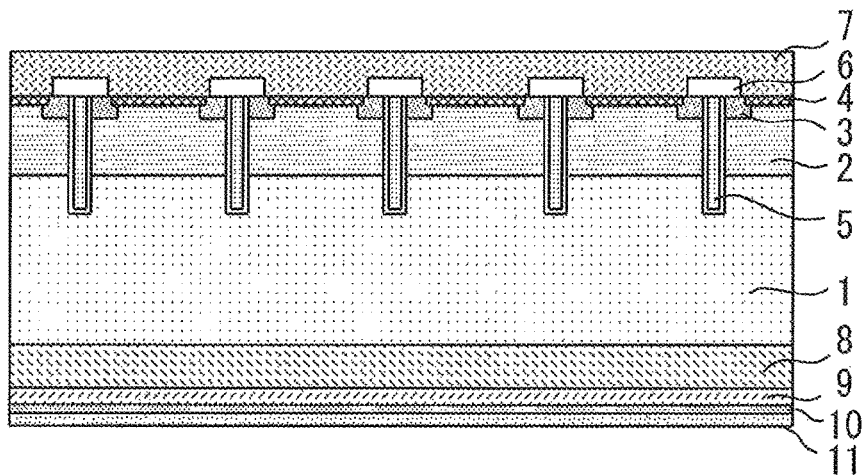
[FIG. 2]
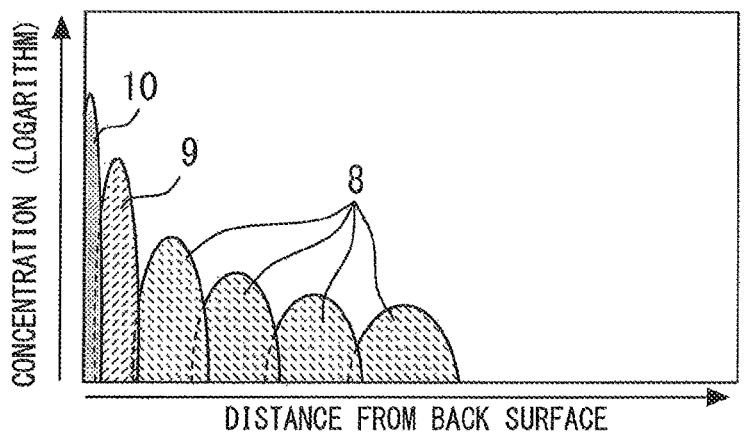
[FIG. 3]
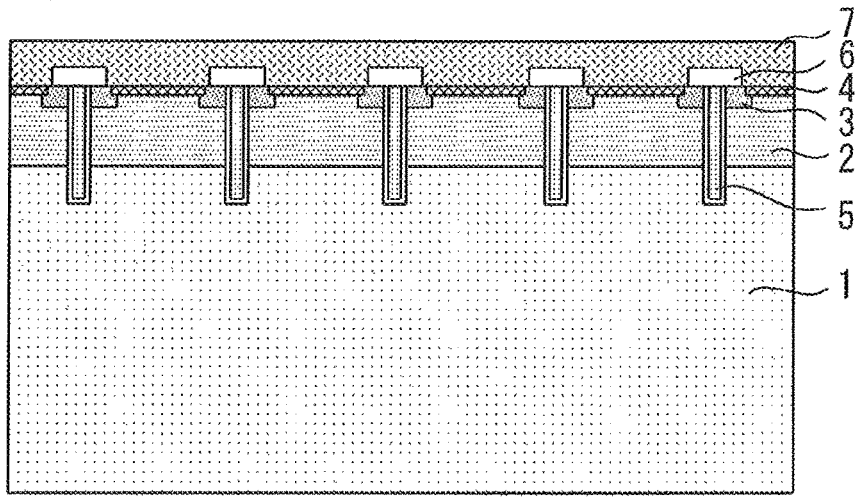

[FIG. 4]
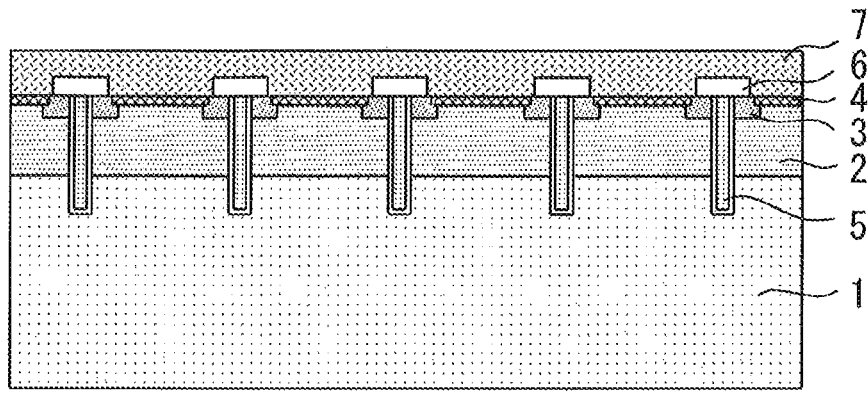
[FIG. 5]
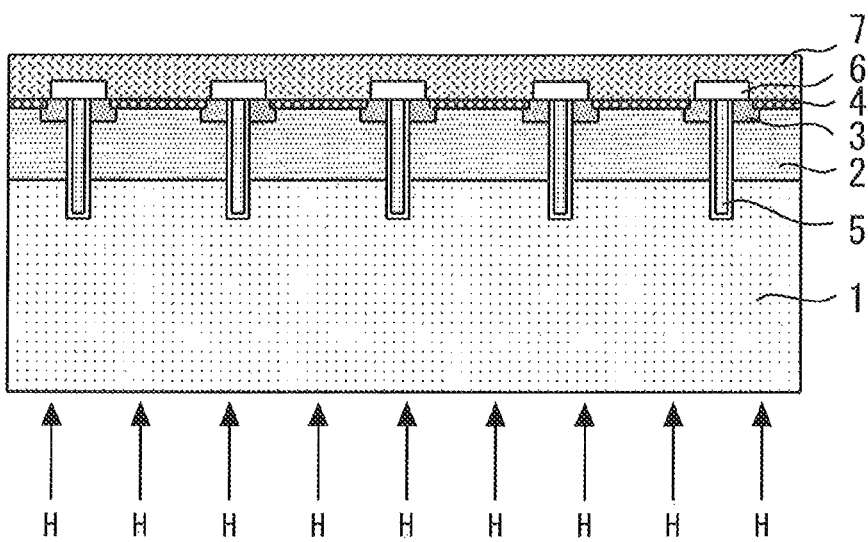
[FIG. 6]
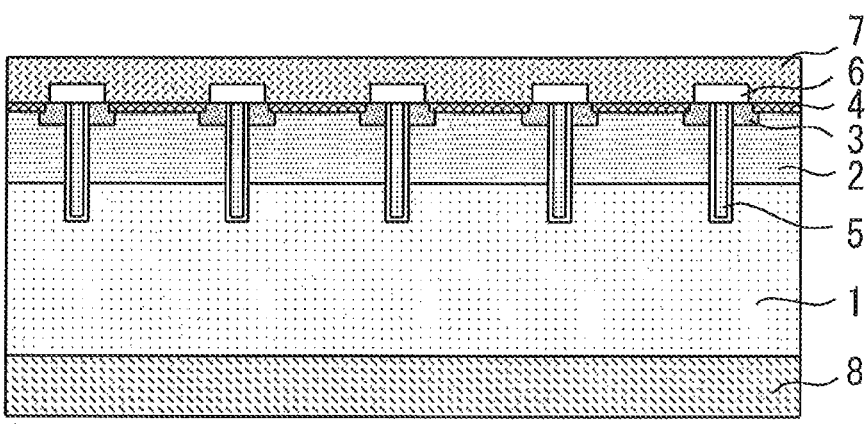

[FIG. 7]
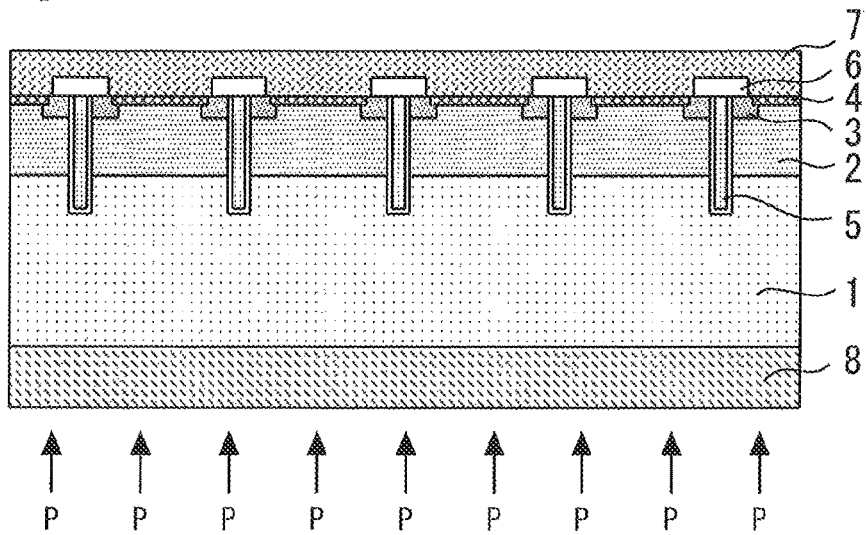
[FIG. 8]
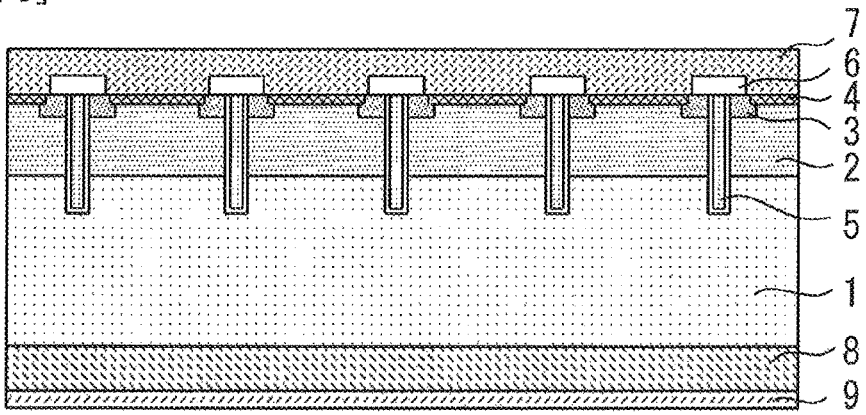
[FIG. 9]
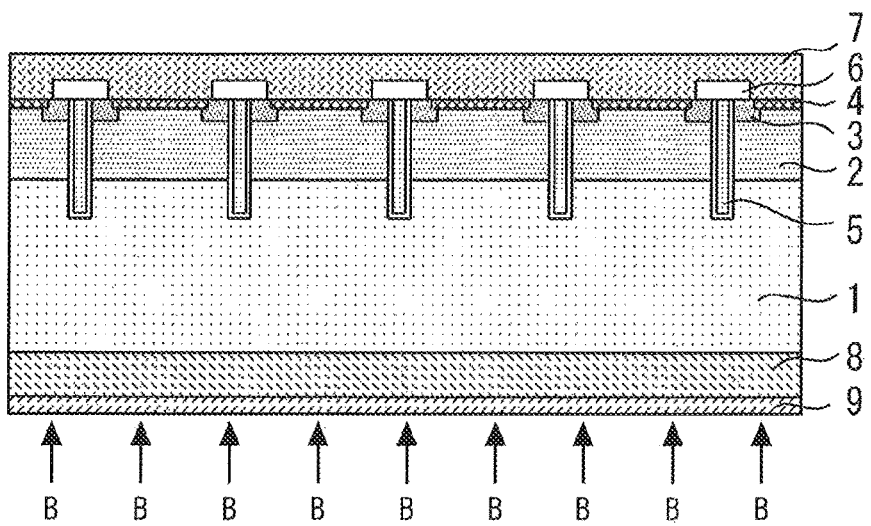

[FIG. 10]
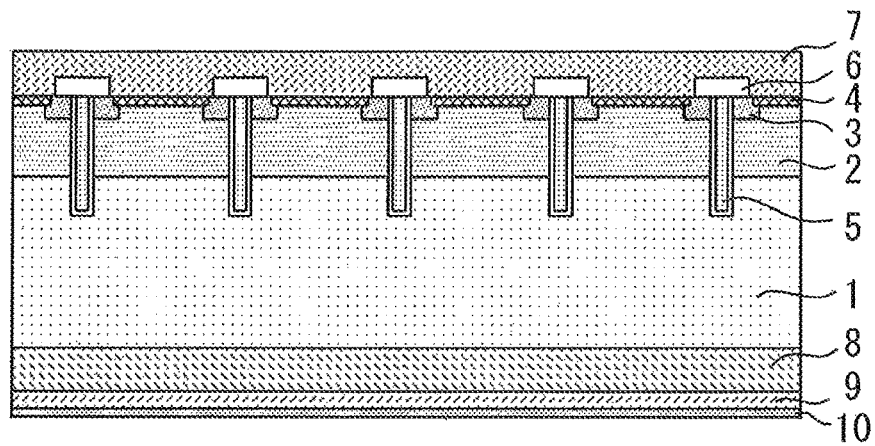
[FIG. 11]
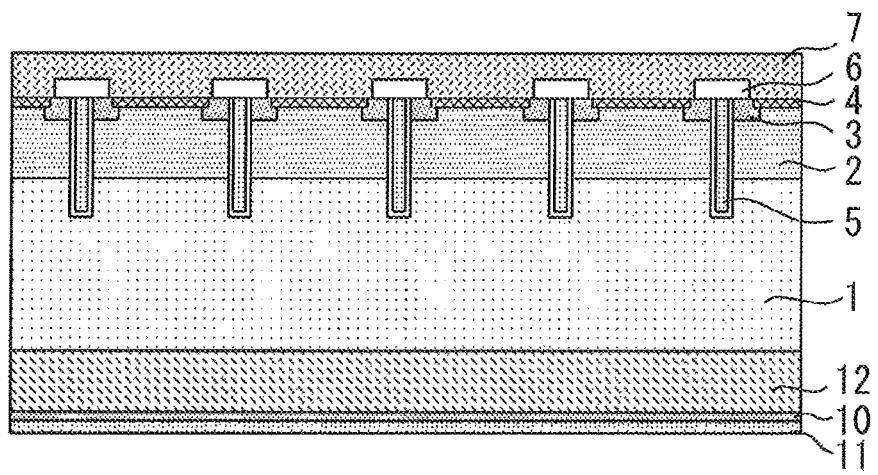
[FIG. 12]
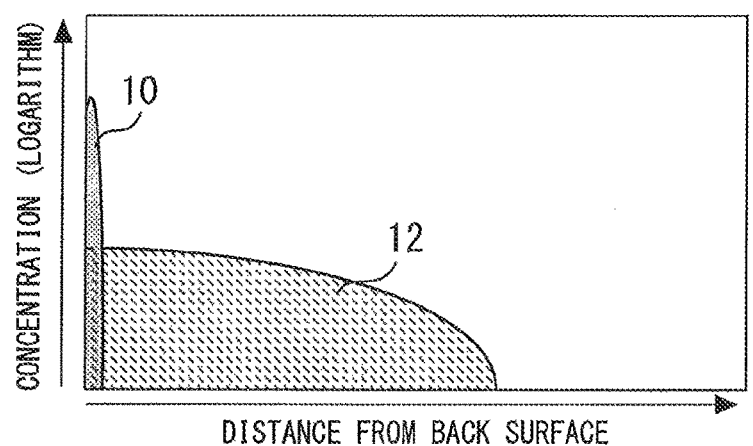

[FIG. 13]
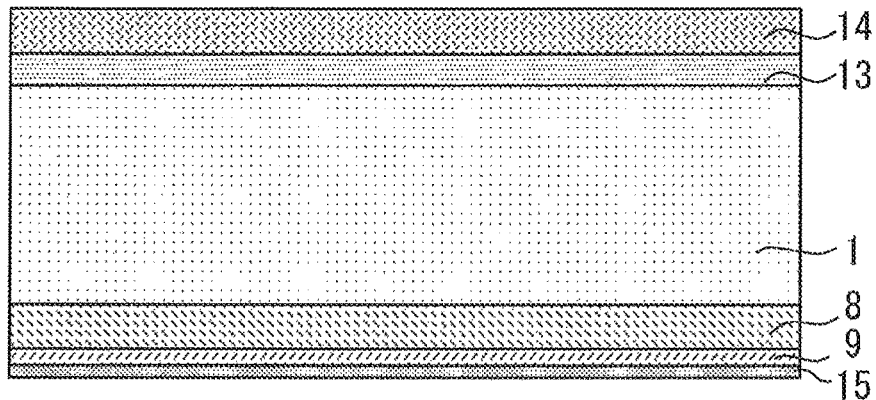
[FIG. 14]
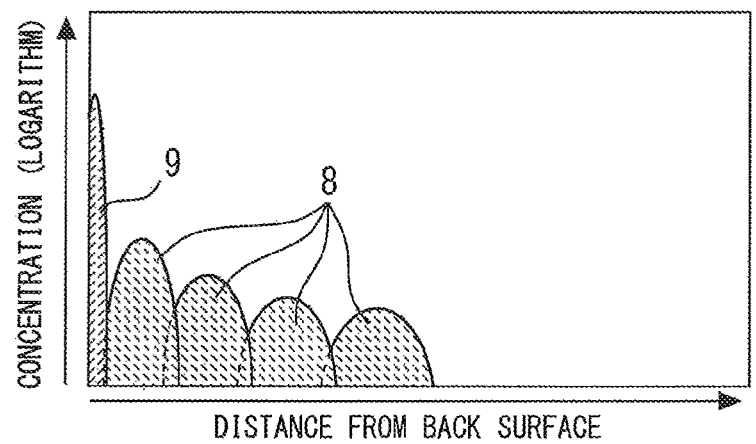
[FIG. 15]
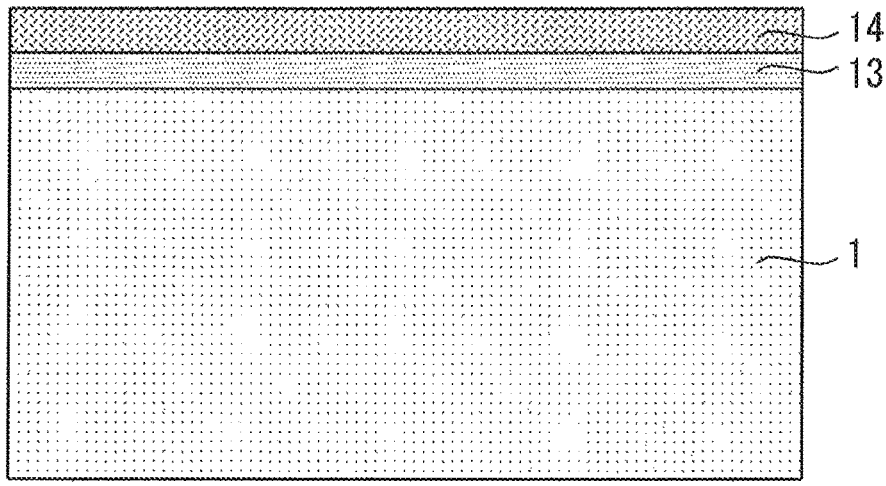

[FIG. 16]
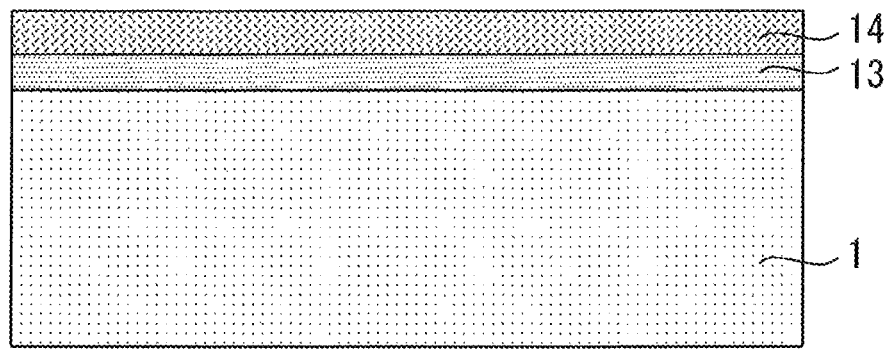
[FIG. 17]
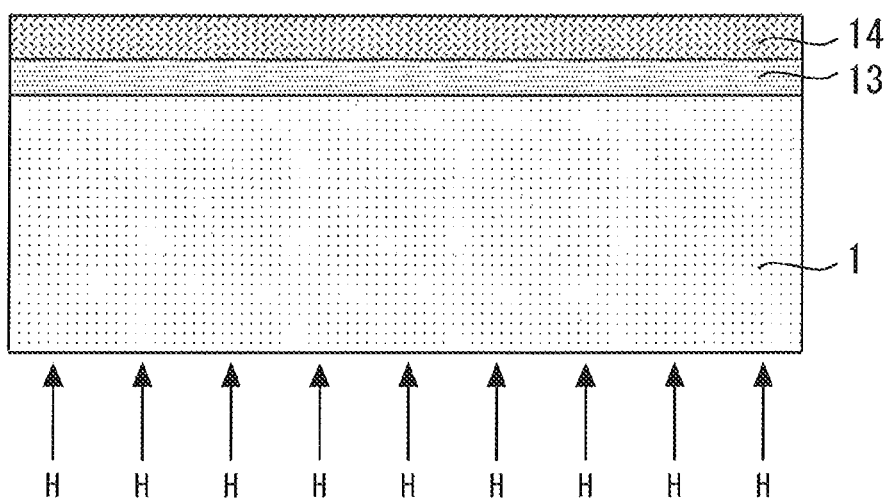
[FIG. 18]
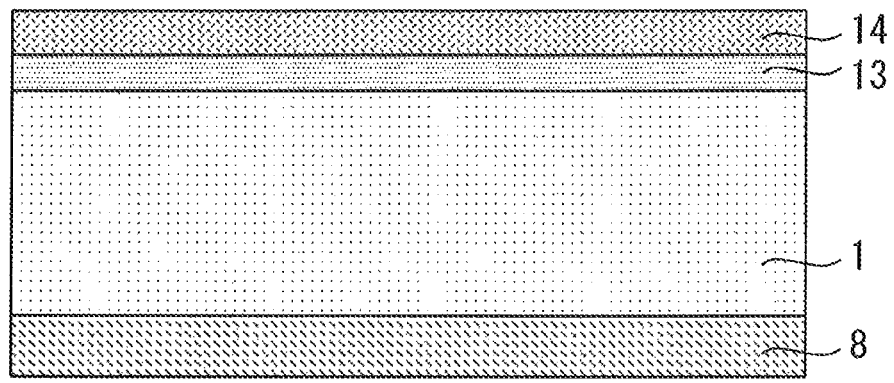

[FIG. 19]
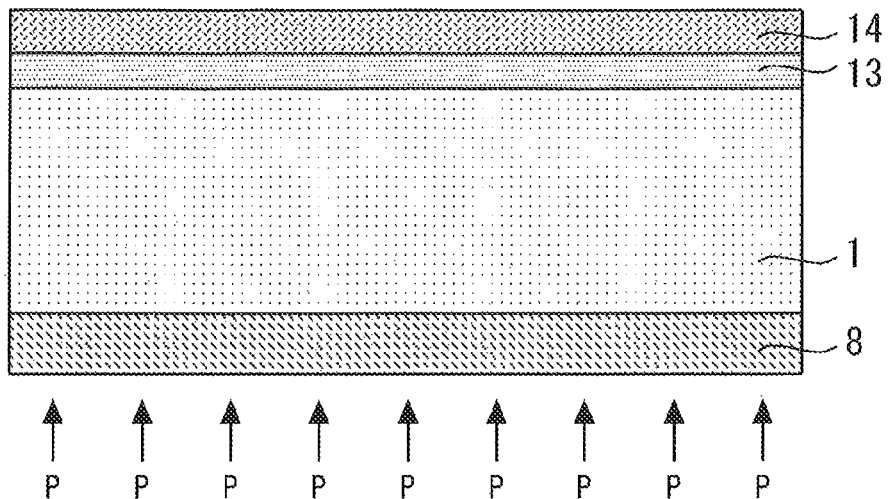
[FIG. 20]
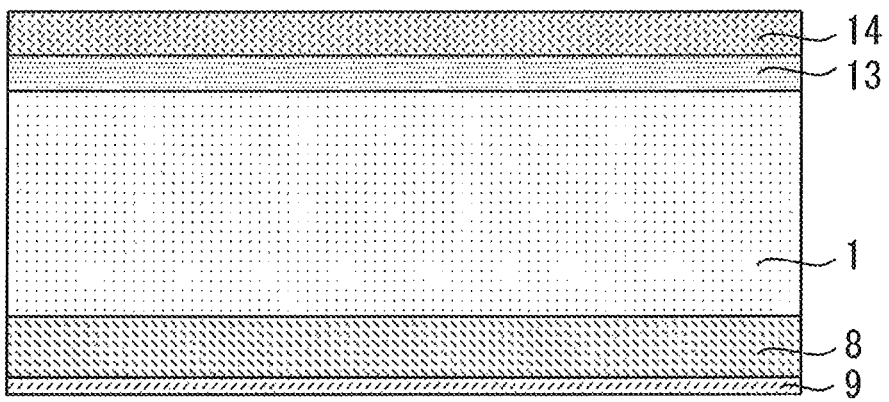
[FIG. 21]
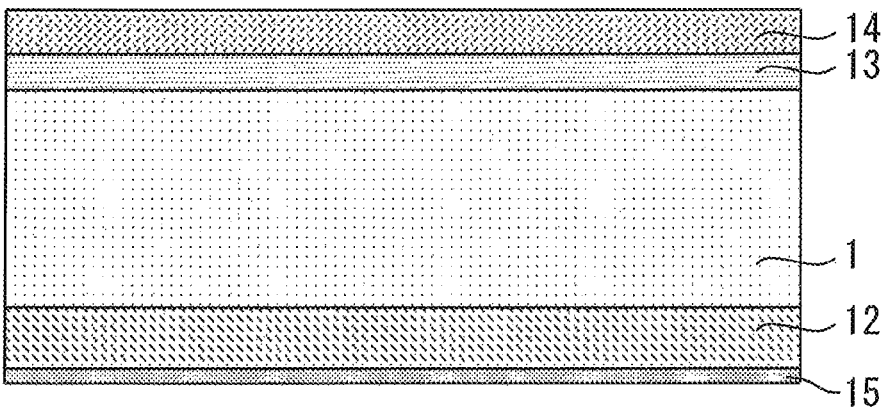

[FIG. 22]
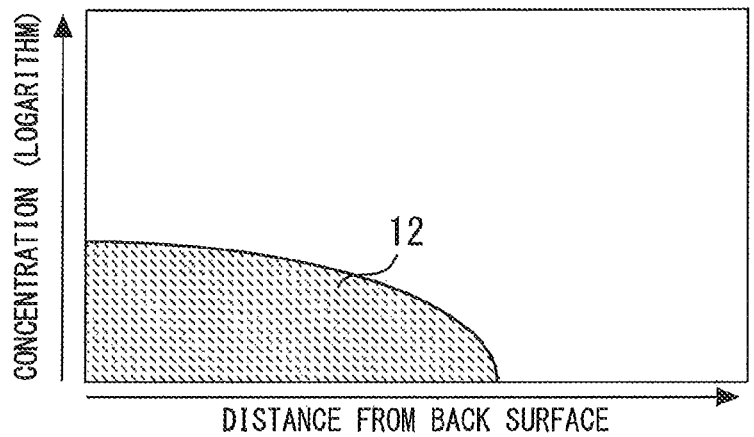
[FIG. 23]
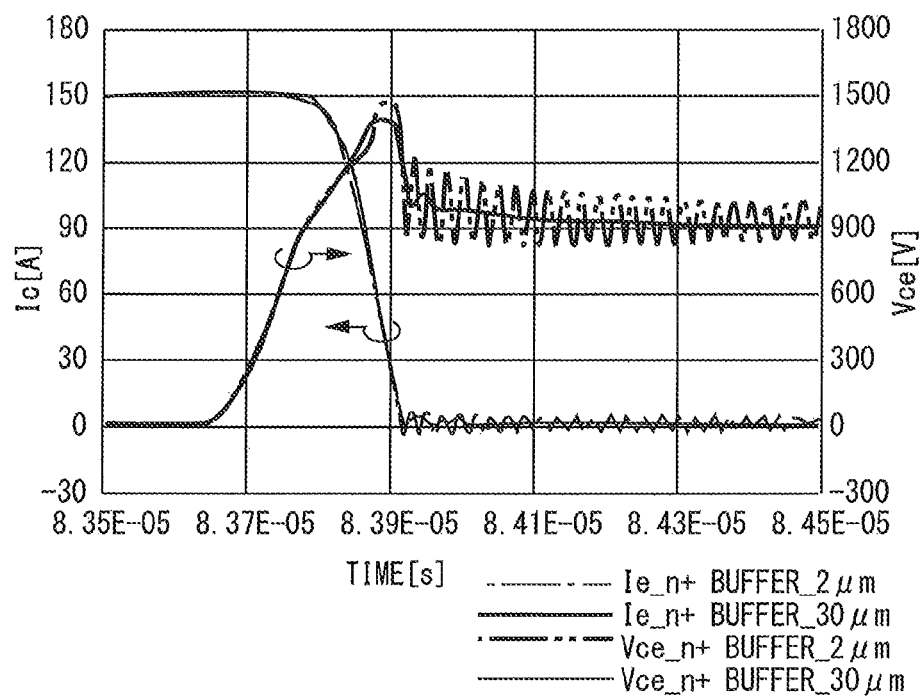

SEMICONDUCTOR DEVICE AND METHOD OF MANUFACTURING THE SAME

FIELD

The present invention relates to a semiconductor device such as a diode or an insulated gate bipolar transistor (IGBT) and a method for manufacturing the same, and more specifically to a semiconductor device which enables leakage current to be reduced, oscillation during turn-off and during recovery to be suppressed, and an n-type buffer layer to be readily formed by proton implantation even in an ordinary semiconductor factory, and a method of manufacturing the semiconductor device.

BACKGROUND

From the perspective of energy conservation, IGBTs and diodes are used in power modules and the like for performing variable speed control of three-phase motors in the fields of general-purpose inverters, AC servo motors, and the like. As an IGBT or a diode, a device with low switching, loss and low on-voltage is desired in order to reduce inverter loss.

Resistance of a thick n-type base layer necessary for withstand voltage retention is responsible for most of an on-voltage, and the resistance is effectively reduced by thinning a wafer. However, in the case of a thinned wafer, a depletion layer reaches a back surface when voltage is applied to a collector and a decline in withstand voltage or an increase in leakage current occurs. Therefore, generally, a shallow $n^+$-type buffer layer with a higher concentration than a substrate concentration is formed on a back surface of a substrate by an ion implanter.

However, due to reductions in wafer thickness down to a vicinity of a thickness where withstand voltage can be secured in accordance with advances in IGBT manufacturing techniques, with a shallow $n^+$-type buffer layer, when a surge voltage determined by power supply voltage +L*di/dt is applied between a collector and an emitter or between a cathode and an anode during a itching operation of an IGBT or a diode and a depletion layer reaches a back surface side, a carrier becomes depleted and oscillations of voltage and current occur. An occurrence of oscillations generates radiation noise which adversely affects peripheral electronic devices.

On the other hand, by forming a deep $n^+$-type buffer layer of around 30 μm with a low concentration on a substrate back surface, even when a large voltage is applied to a collector or a cathode during switching, a depletion layer can be gradually stopped. As a result, by preventing a carrier on the back surface side from becoming depleted and causing the carrier to stay on the back surface side, an abrupt rise in voltage can be prevented.

FIG. 23 is a diagram showing a turn-off waveform of L load switching performed in a device simulation using an IGBT with a withstand voltage of around 1200 V. Switching conditions include: $n^+$-type buffer layers formed of phosphorus with depths of 2 μm and 30 μm; Vce=900 V; and Ic=150 A. While the waveform oscillates at the depth of 2 μm, no oscillation occurs at 30 μm.

Creating a deep $n^+$-type buffer layer with a thickness of around 30 μm by diffusion of phosphorus takes 24 hours or more at a general heat treatment temperature such as 1100° C. and mass productivity is low. Other methods include using, an accelerator such as a cyclotron or a Van de Graaff generator (for example, refer to PTL 1). For example, irradiating a silicon substrate with protons at an accelerating voltage of 8 MeV yields a range of approximately 480 μm and a half-value width of approximately 20 μm. By driving protons through an absorber, instead of driving the same directly into the silicon substrate in order to adjust a position of a range, irradiation energy can be decelerated and a broad proton peak can be created near a surface of silicon. Subsequently, by performing heat treatment of 1 to 5 hours at 350° C. to 450° C., protons are activated and an n-type region can be formed. Moreover, although also dependent on implantation conditions and heat treatment conditions, an activation rate of protons is around 1%.

CITATION LIST

Patent Literature

[PTL 1] Japanese Patent Application Laid-open No. 2013-138172

SUMMARY OF INVENTION

Technical Problem

A mechanism by which a proton turns into an, n-type donor is determined by a combination of factors including implanted hydrogen atoms, crystal defects formed during implantation, and oxygen atoms remaining on a substrate, and activation rates fluctuate depending on a silicon substrate forination method, a concentration of solid solution oxygen, proton implantation conditions, and the like. A fluctuation in a concentration of an $n^+$-type buffer layer formed by proton implantation causes a variation in leakage currents or on-voltage, a decline in short-circuit tolerance, and the like.

In addition, regarding an IGBT or a diode, in order to fabricate a broad back-surface $n^+$-type buffer layer with a depth of around 30 μm, protons must be implanted with an increased half-value width at a high accelerating voltage of around 8 MeV. In contrast, an accelerator such as a cyclotron or a Van de Graaff generator was conventionally used. However, due to radiation issues, a main body of these accelerators must be enclosed by a concrete screen with a thickness of 1 to 4 m which prevents these accelerators from being readily used inside an ordinary semiconductor factory.

The present invention has been made in order to solve problems such as those described above and an object thereof is to provide a semiconductor device which enables leakage current to be reduced, oscillation during turn-off and during recovery to be suppressed, and an n-type buffer layer to be readily formed by proton implantation even in an ordinary semiconductor factory, and a method of manufacturing the semiconductor device.

Solution to Problem

A semiconductor device according to the present invention includes: a semiconductor substrate; a p-type layer formed on a surface of the semiconductor substrate; and first and second n-type buffer layers formed on a back surface of the semiconductor substrate, wherein the first n-type buffer layer is formed by a plurality of implantations of protons at different accelerating voltages and has a plurality of peak concentrations with different depths from the back surface of the semiconductor substrate, the second n-type buffer layer is formed by an implantation of a phosphorus, a position of a peak concentration of the phosphorus is, shallower from the back surface of the semiconductor substrate than positions of peak concentrations of the protons, the peak concentration of the phosphorus is higher than the peak concentrations of the protons, and a concentration of the protons is higher than a concentration of the phosphorus at the positions of the peak concentrations of the protons.

Advantageous Effects of Invention

According to the present invention, oscillation during turn-off of an IGBT or during recovery of a diode can be prevented by the first n-type buffer layer which is formed by proton implantation and which has a low concentration and a deep diffusion depth. In addition, a depletion layer can be stopped by the high-concentration second n-type buffer layer implanted with phosphorus to prevent an increase in leakage currents, Furthermore, the first n-type buffer layer can be readily formed by proton implantation even in an ordinary semiconductor factory without having to use a cyclotron.

BRIEF DESCRIPTION OF THE DRAWINGS

FIG. 1 is a sectional view showing a semiconductor device according to a first embodiment of the present invention.

FIG. 2 is a diagram showing a back surface profile of a semiconductor device according to the first embodiment of the present invention.

FIG. 3 is a sectional view showing a manufacturing process of a semiconductor device according to the first embodiment of the present invention.

FIG. 4 is a sectional view showing a manufacturing process of a semiconductor device according to the first embodiment of the present invention.

FIG. 5 is a sectional view showing a manufacturing process of a semiconductor device according to the first embodiment of the present invention.

FIG. 6 is a sectional view showing a manufacturing process of a semiconductor device according to the first embodiment of the present invention.

FIG. 7 is a sectional view showing a manufacturing process of a semiconductor device according to the first embodiment of the present invention.

FIG. 8 is a sectional view showing a manufacturing, process of a semiconductor device according to the first embodiment of the present invention.

FIG. 9 is a sectional view showing a manufacturing process of a semiconductor device according to the first embodiment of the present invention.

FIG. 10 is a sectional view showing a manufacturing process of a semiconductor device according to the first embodiment of the present invention.

FIG. 11 is a sectional view showing a semiconductor device according to a first comparative example.

FIG. 12 is a diagram showing a back surface profile of the semiconductor device according to the first comparative example.

FIG. 13 is a sectional view showing a semiconductor device according to a second embodiment of the present invention.

FIG. 14 is a diagram showing a back surface profile of the semiconductor device according to the second embodiment of the present invention.

FIG. 15 is a sectional view showing a manufacturing process of a semiconductor device according to the second embodiment of the present invention.

FIG. 16 is a sectional view showing a manufacturing process of a semiconductor device according to the second embodiment of the present invention.

FIG. 17 is a sectional view showing a manufacturing process of a semiconductor device according to the second embodiment of the present invention.

FIG. 18 is a sectional view showing a manufacturing process of a semiconductor device according to the second embodiment of the present invention.

FIG. 19 is a sectional view showing a manufacturing process of a semiconductor device according to the second embodiment of the present invention.

FIG. 20 is a sectional view showing a manufacturing process of a semiconductor device according to the second embodiment of the present invention.

FIG. 21 is a sectional view showing a semiconductor device according to a second comparative example.

FIG. 22 is a diagram showing, a back surface profile of the semiconductor device according to the second comparative example.

FIG. 23 is a diagram showing a turn-off waveform of L load switching performed in a device simulation using an IGBT with a withstand voltage of around 1200 V.

DESCRIPTION OF EMBODIMENTS

A semiconductor device and a method of manufacturing the same according to the embodiments of the present invention will be described with reference to the drawings. The same components will be denoted by the same symbols, and the repeated description thereof may be omitted.

First Embodiment

FIG. 1 is a sectional view showing a semiconductor device according to a first embodiment of the present invention. This semiconductor device is an IGBT. A p-type base layer 2 is formed on a surface of an n-type silicon substrate 1. An $n^+$-type emitter layer 3 and a $p^+$-type contact layer 4 are formed on the p-type base layer 2, A trench gate 5 is formed via a gate insulating film in a trench penetrating the p-type base layer 2 and the $n^+$-type emitter layer 3. An interlayer insulating film 6 is formed on the trench gate 5. An emitter electrode 7 is formed on the surface of the n-type silicon substrate 1 and is connected to the pttype contact layer 4.

First and second $n^+$-type buffer layers 8 and 9 are formed on a back surface of the n-type silicon substrate 1. The first $n^+$-type buffer layer 8 is formed by a plurality of proton implantations at different accelerating voltages. The second $n^+$-type buffer layer 9 is formed by an implantation of a phosphorus. A p-type collector layer 10 with a depth of around 1.0 μm is formed at a shallower position from a back surface of the n-type silicon substrate 1 than the first and second $n^+$-type buffer layers 8 and 9. A collector electrode 11 is formed on the back surface of the n-type silicon substrate 1 and is connected to the p-type collector layer 10.

FIG. 2 is a diagram showing a back surface profile of a semiconductor device according to the first embodiment of the present invention. Protons of the first $n^+$-type buffer layer 8 have a plurality of peak concentrations with different depths from a back surface of the n-type silicon substrate 1. A position of a peak concentration of phosphorus of the second $n^+$-type buffer layer 9 is shallower from the back surface of the n-type silicon substrate 1 than positions of the peak concentrations of protons of the first $n^+$-type buffer layer 8. The peak concentration of phosphorus is higher than the peak concentrations of the protons. The concentration of protons is higher than the concentration of phosphorus at the positions of the peak concentrations of the protons.

FIGS. 3 to 10 are sectional views showing a manufacturing process of a semiconductor device according, to the first embodiment of the present invention. First, as shown in FIG. 3, an IGBT surface structure is formed by an ordinary surface process, At this point, a wafer thickness is around 700 μm which is approximately the same as a bare wafer.

Next, as shown in FIG. 4, a back surface side of the n-type silicon substrate 1 is polished to a desired thickness by a grinder or wet etching. Subsequently, as shown in FIG. 5, using an ordinary ion implanter for manufacturing semiconductors, protons are implanted a plurality of times at different accelerating voltages of 500 keV or higher and 1.5 MeV or lower into the back surface of the n-type silicon substrate 1. The range of the protons is approximately 6 μm at 500 keV and approximately 30 μm at 1500 keV.

Next, as shown in FIG. 6, protons are activated by furnace annealing at 350° C. to 450° C. to form the first $n^+$-type buffer layer 8. Subsequently, as shown in FIG. 7, phosphorus is implanted into a shallow region of the back surface of the n-type silicon substrate 1 at an accelerating voltage of 1 MeV or lower. Next, as shown in FIG. 8, phosphorus is activated by laser annealing to form the second $n^+$-type buffer layer 9.

Subsequently, as shown in FIG. 9, B is implanted into the back surface of the n-type silicon substrate 1. Next, as shown in FIG. 10, laser annealing is performed to form the $p^+$-type contact layer 4. Subsequently, the collector electrode 11 constituted by Al/Ti/Ni/Au, AlSi/Ti/Ni/Au, or the like is formed by sputtering on the back surface of the n-type silicon substrate 1. Finally, heat treatment of around 350° C. is performed to obtain ohmic contact between the collector electrode 11 and the n-type silicon substrate 1 in order to reduce contact resistance. At this point, by performing this heat treatment in a same process as the heat treatment for activating the protons, processing cost can be reduced since one heat treatment process can be eliminated.

Next, an effect, of the present embodiment will be described by a comparison with a comparative example. FIG. 11 is a sectional view showing a semiconductor device according to a first comparative example. FIG. 12 is a diagram showing a back surface profile of the semiconductor device according to the first comparative example. In the first comparative example, a deep $n^+$-type buffer layer 12 of around 30 μm is formed by proton implantation using an accelerator such as a cyclotron or a Van de Graaff generator.

Implanting protons at 1.5 MeV yields a range of approximately 30 μm and enables a deep buffer layer expected to produce an effect of suppressing oscillations to be formed. Even with an ordinary ion implanter for manufacturing semiconductors, accelerating voltage can be increased to around 1.5 MeV. However, since a diffusion layer formed at a low accelerating voltage with an ion implanter for manufacturing semiconductors has a short half-value width, it is difficult to create a broad diffusion layer as though fabricated by a cyclotron.

In consideration thereof, in the present embodiment, by performing a plurality of proton implantations at different accelerating voltages such as 500 keV, 1000 keV, and 1500 keV, the first $n^+$-type buffer layer 8 having a relatively broad profile as shown in FIG. 2 can be formed.

However, as a result of performing a plurality of implantations, the shallower from the substrate back surface, the greater the number of internally created crystal defects. Since the activation of protons is also dependent on the amount of crystal defects, a variation in a concentration of an n-type layer may occur. In consideration thereof, by forming a high-concentration second $n^+$-type buffer layer 9 near the back surface by phosphorus implantation, a depletion layer can be prevented from reaching a collector side when voltage is applied and a decline in withstand voltage and an increase in leakage currents can be suppressed.

In addition, since phosphorus has an atomic radius that is larger than a proton, a large number of implantation damage occurs during implantation as atomic nuclei collide with each other and, when an implantation profile of phosphorus overlaps with an implantation profile of protons, conversion of protons into donors may be affected. In consideration thereof, in the present embodiment, a peak position is set so that the concentration of protons is higher than the concentration of phosphorus at the positions of the peak concentrations of the protons. Accordingly, mutual interference can be prevented and the first $n^+$-type buffer layer 8 formed by the activation of protons can be given a desired concentration.

As described above, according to the present embodiment, oscillation of the IGBT during turn-off can be prevented by the first $n^+$-type, buffer layer 8 which is formed by proton implantation and which has a low concentration and a deep diffusion depth. In addition, a depletion layer can be stopped by the high-concentration second $n^+$-type buffer layer 9 implanted with phosphorus to prevent an increase in leakage currents.

Furthermore, the first $n^+$-type buffer layer 8 is formed by performing a plurality of proton implantations at different accelerating voltages using an ordinary ion implanter for manufacturing semiconductors. Accordingly, the first $n^+$-type buffer layer 8 can be readily formed by proton implantation even in an ordinary semiconductor factory without having to use a cyclotron.

In addition, when performing the plurality of proton implantations, favorably, the higher the accelerating voltage, the smaller the implantation amount. Accordingly, a profile of the first $n^+$-type buffer layer 8 formed by the plurality of proton implantations can be approximated to a Gaussian distribution.

Furthermore, favorably, an implantation amount of a profile with a highest accelerating voltage and an implantation amount of a profile with a next highest accelerating voltage among the plurality of proton implantations are the same. Accordingly, a profile with an extremely gradual gradient can be formed and thus a depletion layer which spreads during turn-off of an IGBT or during recovery of a diode can be gradually stopped. As a result, a carrier can be prevented from becoming swept out and depleted.

In addition, an implantation amount of phosphorus is set smaller than an implantation amount of protons, the activation of phosphorus is performed by laser annealing, and the activation of protons is performed by furnace annealing at 350° C. to 450° C. By performing the activation of phosphorus by laser annealing, an activation rate is increased to around 70%. On the other hand, an activation rate of protons by furnace annealing is around 1%. Therefore, even when the implantation amount of phosphorus is set smaller than the implantation amount of protons, a peak concentration of phosphorus can be set sufficiently higher than a peak concentration of protons. As a result, a conversion of a proton implantation region in the proximity of a phosphorus implantation region into a donor can be performed while suppressing an effect of damages caused by phosphorus implantation.

Second Embodiment

FIG. 13 is a sectional view showing a semiconductor device according to a second embodiment of the present invention. This semiconductor device is a diode. A p-type anode layer 13 is formed on a surface of an n-type silicon substrate 1. An anode electrode 14 is formed on the surface of the n-type silicon substrate 1 and is connected to the p-type anode layer 13. In a similar manner to the first embodiment, first and second $n^+$-type buffer layers 8 and 9 are formed on a back surface of the n-type silicon substrate 1. A cathode electrode 15 is formed on the back surface of the n-type silicon substrate 1 and is connected to the second $n^+$-type buffer layer 9.

FIG. 14 is a diagram showing a back surface profile of the semiconductor device according to the second embodiment of the present invention. In a similar manner to the first embodiment, protons of the first $n^+$-type buffer layer 8 have a plurality of peak concentrations with different depths from the back surface of the n-type silicon substrate 1. A position of a peak concentration of phosphorus of the second $n^+$-type buffer layer 9 is shallower from the back surface of the n-type silicon substrate 1 than positions of the peak concentrations of protons of the first $n^+$-type buffer layer 8. The peak concentration of phosphorus is higher than the peak concentrations of the protons. The concentration of protons is higher than the concentration of phosphorus at the positions of the peak concentrations of the protons.

FIGS. 15 to 20 are sectional views showing a manufacturing process of a semiconductor device according to the second embodiment of the present invention. First, as shown in FIG. 15, a diode surface structure is formed by an ordinary surface process. At this point, a wafer thickness is around 700 µm which is approximately the same as a bare wafer.

Next, as shown in FIG. 16, a back surface side of the n-type silicon substrate 1 is polished to a desired thickness by a grinder or wet etching. Subsequently, as shown in FIG. 17, using an ordinary ion implanter for manufacturing semiconductors, protons are implanted a plurality of times at different accelerating voltages of 500 keV or higher and 1.5 MeV or lower into the back surface of the n-type silicon substrate 1. The range of the protons is approximately 6 µm at 500 keV and approximately 30 µm at 1500 keV.

Next, as shown in FIG. 18, protons are activated by furnace annealing at 350° C. to 450° C. to form the first $n^+$-type buffer layer 8. Subsequently, as shown in FIG. 19, phosphorus is implanted into a shallow region of the back surface of the n-type silicon substrate 1 at an accelerating voltage of 1 MeV or lower. Next, as shown in FIG. 20, phosphorus is activated by laser annealing to form the second $n^+$-type buffer layer 9.

Subsequently, the cathode electrode 15 constituted by Al/Ti/Ni/Au, AlSi/Ti/Ni/Au, or the like is formed by sputtering on the back surface of the n-type silicon substrate 1. Finally, heat treatment of around 350° C. is performed to obtain ohmic contact between the cathode electrode 15 and the n-type silicon substrate 1 in order to reduce contact resistance. At this point, by performing this heat treatment in a same process as the heat treatment for activating the protons, processing cost can be reduced since one heat treatment process can be eliminated.

Next, an effect of the present embodiment will be described by a comparison with a comparative example. FIG. 21 is a sectional view showing a semiconductor device according to a second comparative example. FIG. 22 is a diagram showing a back surface profile of the semiconductor device according to the second comparative example. In the second comparative example, a deep $n^+$-type buffer layer 12 of around 30 µm is formed by proton implantation using an accelerator such as a cyclotron or a Van de Graaff generator.

In comparison, in the present embodiment, in a similar manner to the first embodiment, oscillation of the diode during recovery can be prevented by the first $n^+$-type buffer layer 8 which is formed by proton implantation and which has a low concentration and a deep diffusion depth. In addition, a depletion layer can be stopped by the high-concentration second $n^+$-type buffer layer 9 implanted with phosphorus to prevent an increase in leakage currents, Furthermore, the first $n^+$-type buffer layer 8 can be readily formed by proton implantation even in an ordinary semiconductor factory without having to use a cyclotron.

The semiconductor substrate is not limited to silicon and may be formed of a wide-band-gap semiconductor having a band gap larger than that of silicon. The wide-band-gap semiconductor is, for example, silicon carbide, a gallium nitride-based material or diamond. A power semiconductor device formed of such a wide-band-gap semiconductor has a high withstand voltage and a high allowable current density and can therefore be reduced in size. A semiconductor module incorporating the semiconductor device reduced in size can also be reduced in size. Also, radiating fins of a heat sink can be made smaller in size and a water-cooling part can be replaced with an air-cooling part, because the semiconductor device has high heat resistance. Also, the device has a low power loss and high efficiency and the efficiency of the semiconductor module can therefore be improved.

REFERENCE SIGNS LIST 1 n-type silicon substrate (semiconductor substrate), 2 p-type base layer (p-type layer), 8 first $n^+$-type buffer layer (first n-type buffer layer), 9 second $n^+$-type buffer layer (second n-type buffer layer), 11 collector electrode (back electrode), 13 p-type anode layer (p-type layer), 15 cathode electrode (back electrode)

The invention claimed is:
1. A semiconductor device comprising:
a semiconductor substrate;
a p-type layer formed on a surface of the semiconductor substrate; and
first and second n-type buffer layers formed on a back surface of the semiconductor substrate,
wherein the first n-type buffer layer is formed by a plurality of implantations of protons at different accelerating voltages and has a plurality of peak concentrations with different depths from the back surface of the semiconductor substrate,
the second n-type buffer layer is formed by an implantation of a phosphorus,
a position of a peak concentration of the phosphorus is shallower from the back surface of the semiconductor substrate than positions of peak concentrations of the protons,
the peak concentration of the phosphorus is higher than the peak concentrations of the protons, and
a concentration of the protons is higher than a concentration of the phosphorus at the positions of the peak concentrations of the protons.
2. The semiconductor device according to claim 1, wherein the semiconductor device is a diode or an insulated gate bipolar transistor.

3. A method of manufacturing a semiconductor device according to claim 1, wherein the first n-type buffer layer is formed by performing the plurality of implantations of the protons at different accelerating voltages using an ion implanter for manufacturing semiconductors.

4. The method of manufacturing a semiconductor device according to claim 3, wherein when performing the plurality of implantations of the protons, the higher the accelerating voltage, the smaller the implantation amount.

5. The method of manufacturing a semiconductor device according to claim 3, wherein an implantation amount of a profile with a highest accelerating voltage and an implantation amount of a profile with a next highest accelerating voltage among the plurality of implantations of the protons are same.

6. The method of manufacturing a semiconductor device according to claim 3, wherein an implantation amount of the phosphorus is smaller than an implantation amount of the protons, and
the phosphorus is activated by laser annealing.

7. The method of manufacturing a semiconductor device according to claim 3, wherein the protons are activated by furnace annealing at 350° C. to 450° C.

8. The method of manufacturing a semiconductor device according to claim 3, wherein an accelerating voltage of the phosphorus is 1 MeV or lower.

9. The method of manufacturing a semiconductor device according to claim 3, wherein an accelerating voltage of the protons is 500 keV or higher and 1.5 MeV or lower.

10. The method of manufacturing a semiconductor device according to claim 3, comprising forming a back electrode on a back surface of the semiconductor substrate; and
performing a heat treatment for obtaining ohmic contact between the back electrode and the semiconductor substrate in a same process as a heat treatment for activating the protons.

11. A semiconductor device comprising:
a semiconductor substrate;
a p-type layer formed on a surface of the semiconductor substrate; and
first and second n-type buffer layers formed on a back surface of the semiconductor substrate,
wherein the first n-type buffer layer comprises protons that have a plurality of peak concentrations with different depths from the back surface of the semiconductor substrate,
the second n-type buffer layer comprises phosphorus,
a position of a peak concentration of the phosphorus is shallower from the back surface of the semiconductor substrate than positions of peak concentrations of the protons,
the peak concentration of the phosphorus is higher than the peak concentrations of the protons, and
a concentration of the protons is higher than a concentration of the phosphorus at the positions of the peak concentrations of the protons.

* * * * *